United States Patent
Shou et al.

[11] Patent Number: 5,774,008
[45] Date of Patent: *Jun. 30, 1998

[54] COMPUTATIONAL CIRCUIT

[75] Inventors: Guoliang Shou; Sunao Takatori; Makoto Yamamoto, all of Tokyo, Japan

[73] Assignees: Yozan Inc, Tokyo; Sharp Corporation, Osaka, both of Japan

[*] Notice: The term of this patent shall not extend beyond the expiration date of Pat. No. 5,666,080.

[21] Appl. No.: 766,875

[22] Filed: Dec. 13, 1996

Related U.S. Application Data

[63] Continuation of Ser. No. 262,059, Jun. 17, 1994, Pat. No. 5,666,080.

[30] Foreign Application Priority Data

| Apr. 1, 1993 | [JP] | Japan | 6-087720 |
| Jun. 17, 1993 | [JP] | Japan | 5-171041 |
| Jun. 18, 1993 | [JP] | Japan | 5-172551 |
| Jun. 18, 1993 | [JP] | Japan | 5-172552 |
| Jun. 22, 1993 | [JP] | Japan | 5-174713 |
| Jun. 24, 1993 | [JP] | Japan | 5-177362 |
| Jun. 30, 1993 | [JP] | Japan | 5-187215 |
| Sep. 20, 1993 | [JP] | Japan | 5-256355 |
| Sep. 20, 1993 | [JP] | Japan | 5-256359 |
| Sep. 20, 1993 | [JP] | Japan | 5-256367 |
| Sep. 20, 1993 | [JP] | Japan | 5-256518 |
| Sep. 20, 1993 | [JP] | Japan | 5-256557 |
| Sep. 20, 1993 | [JP] | Japan | 5-256558 |

[51] Int. Cl.$^6$ .............. G06G 7/14; G06G 7/42; H03K 17/62
[52] U.S. Cl. ................ 327/361; 327/352; 327/354
[58] Field of Search ................ 327/111, 112, 327/355, 361, 362, 298, 407, 408, 409, 410, 105, 352, 354

[56] References Cited

U.S. PATENT DOCUMENTS

| 3,508,073 | 4/1970 | Everly | 327/361 |
| 3,812,478 | 5/1974 | Tomisawa | 327/355 |
| 3,882,402 | 5/1975 | Jensen | 327/361 |
| 4,616,185 | 10/1986 | Van Roermund | 327/356 |
| 4,703,251 | 10/1987 | Baumgartner | 327/176 |
| 4,760,346 | 7/1988 | Kultgen | 327/408 |
| 4,797,585 | 1/1989 | Segawa et al. | 327/176 |
| 5,254,889 | 10/1993 | Han | 327/105 |
| 5,262,686 | 11/1993 | Kurosawa | 327/77 |
| 5,287,108 | 2/1994 | Mayes | 341/156 |
| 5,302,869 | 4/1994 | Hosotani | 327/75 |
| 5,305,250 | 4/1994 | Salam | 327/356 |
| 5,378,932 | 1/1995 | Shin | 327/333 |
| 5,388,063 | 2/1995 | Takatori | 364/724.17 |
| 5,396,446 | 3/1995 | Shou | 364/825 |
| 5,408,422 | 4/1995 | Takatori | 327/356 |
| 5,410,192 | 4/1995 | Yamada | 327/408 |
| 5,412,263 | 5/1995 | Nagoraj | 327/566 |
| 5,416,370 | 5/1995 | Takatori | 327/356 |
| 5,444,411 | 8/1995 | Yang | 327/361 |
| 5,453,711 | 9/1995 | Yamamoto | 327/355 |
| 5,457,417 | 10/1995 | Shou | 327/356 |

OTHER PUBLICATIONS

Microelectronic circuit, Sedra et al., pp. 930–934, 995–999, by Saunders College Publishing, 1991.
Electronic Circuit by Schilling et al. pp. 145–160 (1989).

*Primary Examiner*—Timothy P. Callahan
*Assistant Examiner*—T. T. Lam
*Attorney, Agent, or Firm*—Cushman Darby & Cushman IP Group of Pillsbury Madison & Sutro LLP

[57] ABSTRACT

Addition is performed by a capacitive coupling or resistive coupling. A quantizing circuit is realized by plurality of thresholding circuits receiving an analog input voltages. Subtraction in performed by two MOSs of anti-polarity inputted analog input voltages to gates.

1 Claim, 8 Drawing Sheets

COMPUTATIONAL CIRCUIT

This is a continuation of application Ser. No. 08/262,059, filed Jun. 17, 1994, U.S. Pat. No. 5,666,080.

BACKGROUND OF THE INVENTION

1. Field of the Invention

The present invention relates to computational circuits for calculating addition, multiplication, comparison, quantizing and exponentials of substantially analog value.

2. Description of the Related Art

In conventional digital computers, computations are performed using many combinations of simple digital logic circuits. Digital computation is good in accuracy and redundancy, however it is limited due to large equipment costs for high precision manufacturing processes. Analog computation was mainly used for solving differential equations, but because of the limitation noted above, analog computation is attracting attention again. Operational amplifiers are used in conventional analog computation. However, a lot of electric power is necessary for large scale computation because it is driven by current. It is difficult to provide a practical circuit for solving a complicated calculation of large scale.

SUMMARY OF THE INVENTION

Therefore, it is an object of the present invention to provide a computational circuit of analog type capable of large scale and complicated computation.

According to the present invention, various combination circuits are proposed in which addition is performed by a capacitive coupling and multiplication is performed by the weighting of a capacitive coupling.

Multiplication is also performed using a logarithmic calculation circuit for transforming a voltage into a time length, which is also useful for exponential calculation.

DETAILED DESCRIPTION OF THE DRAWINGS

Hereinafter, the first embodiment of a computational circuit according to the present invention is described.

Figure 1:
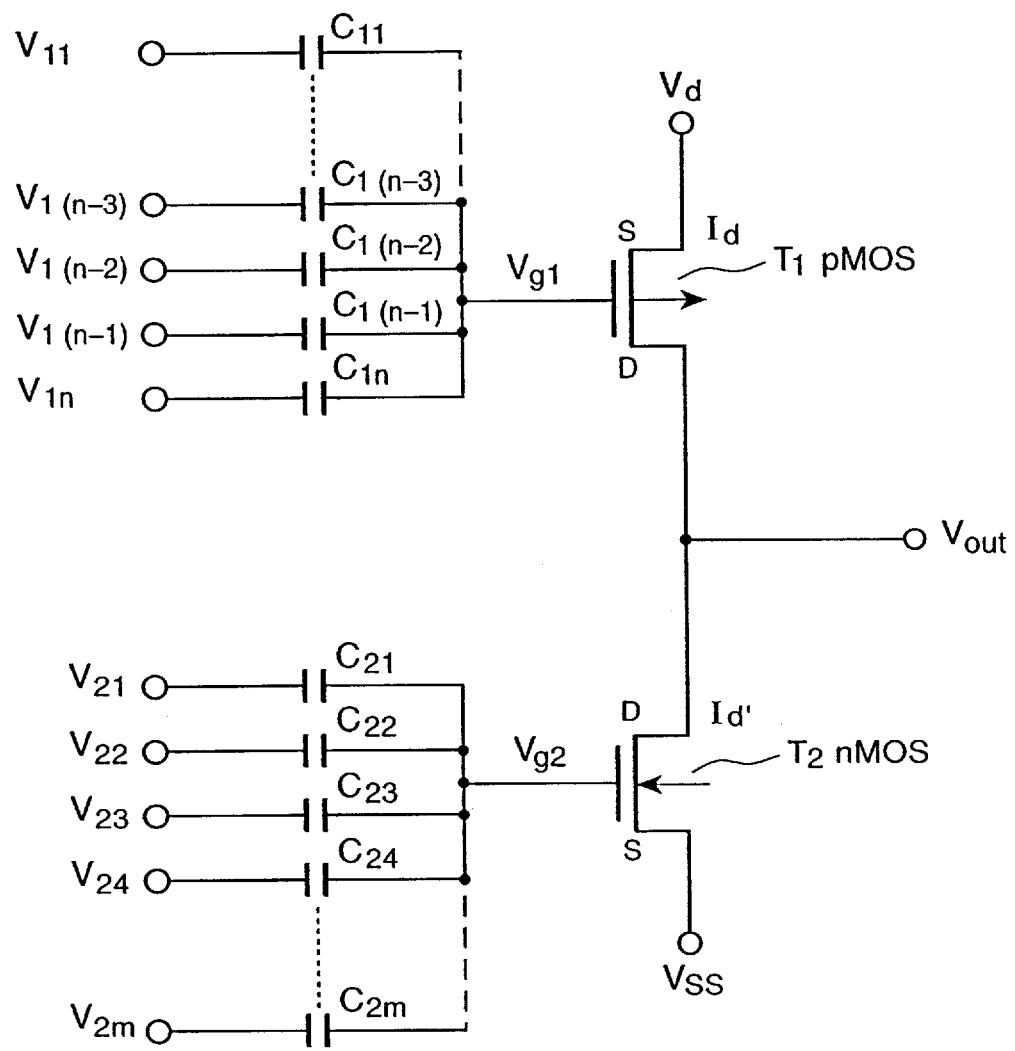
FIG. 1 is a circuit diagram showing the first embodiment of an addition circuit.

In FIG. 1, a circuit for signed addition, that is, for addition and subtraction is shown, modeling a neural network having excitatory and inhibitory synapses. Inputs on the excitatory synapses make an output of the neuron high level such as "1", while inputs on the inhibitory synapses make the output a low level.

Inputs are given as voltage signals from V11 to V1n for excitation and from V21 to V2n for inhibition. The addition circuit includes enhancement type pMOS FET transistor T1 and enhancement type nMOS FET transistor T2, a source of T1 is connected to a high voltage source Vd, the drain of T1 is connected to a drain of T2, and a source of T2 is connected to a low voltage source Vss, for example the ground. The first capacitive coupling is provided for excitatory addition consisting of capacitances C11 to C1n parallelly connected to a gate of T1, each capacitance receiving one of the inputs from V11 to V1n. The second capacitive coupling is provided for inhibitory addition consisting of capacitances C21 to C2n parallelly connected to a gate of T2, each capacitance receiving one of the inputs from V21 to V2n. Capacitive couplings operate as an adding circuit because the integrated output voltage V'out can be defined as follows:

$$V'\text{out} = \sum_{i}^{n} C1iV1i / \sum_{i}^{n} C1i$$

$$V'\text{out} = \sum_{i}^{n} C2iV2i / \sum_{i}^{n} C2i$$

When T1 and T2 operate in the saturated area, that is, $$Vd1 \geq (Vg1-Vt1)>0 \text{ and } Vd2 \geq (Vg2-Vt2)>0 \text{ where} \quad (1)$$

Vd1,Vd2: drain voltage of T1 and T2, respectively,
Vg1,Vg2: gate voltage of T1 and T2, respectively, and
Vt1,Vt2: threshold voltage of T1 and T2, respectively, the current Id and Id' through T1 and T2 are approximately expressed as follows:

$$Id=(k1/2)(W/L)(Vg1-Vt1)^2\{1+\lambda1(Vd-Vout)\} \quad (2)$$

$$Id'=(k2/2)(W/L)(Vg2-Vt2)^2\{1+\lambda2Vout\} \text{ where} \quad (3)$$

$$k1=\mu n1Cox1 \quad (4)$$

$$k2=\mu n2Cox2=2k1 \quad (5)$$

$\mu n1$: carrier mobility in the channel area of T1,
$\mu n2$: carrier mobility in the channel area of T2,
Cox1: capacitance of the gate oxide layer of T1,
Cox2: capacitance of gate oxide layer of T2.
W: channel width,
L: channel length,
$\lambda1$: index representing the output resistance of T1,
$\lambda2$: index representing the output resistance of T2, and
Vout: output voltage between the source of T1 and the drain of T2.

$\lambda1$ and $\lambda2$ are equal to (1/Va), an inversion of the voltage Vds when Id=0 on the extended line of static performance in the saturated area. It is also called "channel length modulation effect factor". Since λ1=λ2, both are represented by "λ".

In the condition that no current flows from the output terminal, the formulas (2) and (3) are equal to each other. Therefore, $$(k1/2)(W/L)(Vg1-Vt1)^2\{1+\lambda(Vd-Vout)\}=(k1/2)(W/L)(Vg2-Vt2)^2\{1+\lambda Vout\} \quad (6)$$

The formula (6) is simplified by replacing the squared terms, as follows $$V1\{1+\lambda(Vd-Vout)\}=2XV2(1+\lambda Vout) \quad (7)$$

$$V1=(Vg1-Vt1)^2, V2=(Vg2-Vt2)^2 \quad (8)$$

By replacing X=(V2/V1), the formula (7) is further simplified.

$$\{1+\lambda(Vd-Vout)\}=2\lambda(1+Vout) \; Vout=(1-2X+\lambda Vd)/\{\lambda(1+2X)\} \quad (9)$$

Figure 2:
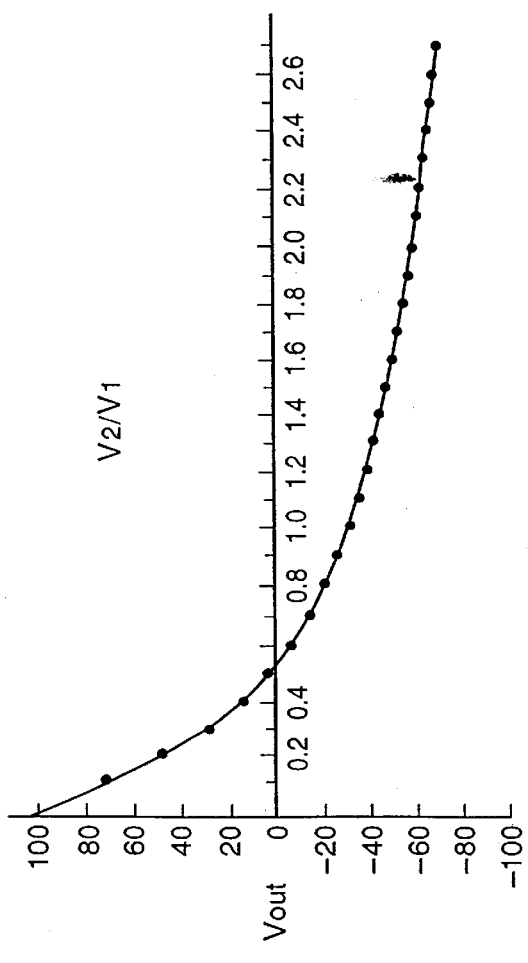
FIG. 2 is a diagram of the input/output characteristics of V2/V1 of the circuit shown in FIG. 1.

Here $$Vou(X(1)+\lambda Vd)/\lambda \quad (10)$$

$$Vout=-(1/\lambda) \; (X \to \infty) \quad (11)$$

and the total performance is shown in FIG. 2.
Next, an inversion of X (1/x) is defined as Z.

$$Vout=(Z+\lambda Vd-2)/\{\lambda(Z+2)\} \quad (12)$$

Figure 3:
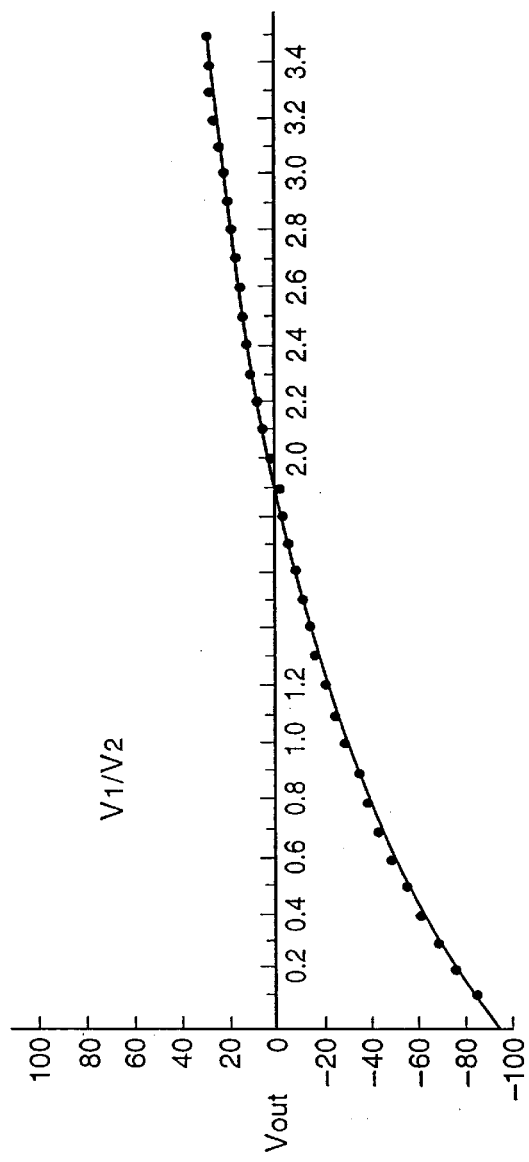
FIG. 3 is another diagram of the output characteristics of V1/V2 of the circuit shown in FIG. 1.

A performance curve of Z is shown in FIG. 3.

From FIGS. 2 and 3, it is apparent that the inclination Vout is steep when X or Z is small, and less steep when X or Z is large. The proportion of Vg1 to Vg2 or its inversion, that is, the proportion of a summation from V1n, V1(n-1), V1(n-2), V1(31 3), . . . , V11, to a summation from V2m, V2(m-1), V2(m-2), V2(m-3), . . . , V21, or its inversion influences Vout more as they become smaller. The formula (9) is partially differentiated by V1.

$$\partial Vout/\partial V1=\{2X(2+\lambda Vd)\}/\{\lambda V1^2(1+2X)\}\geq 0 \quad (13)$$

The formula (9) is partially differentiated by V2.

$$\partial Vout/\partial V2=\{-2(2+\lambda Vd)\}/\{\lambda V1^2(1+2X)\}\leq 0 \quad (14)$$

When Vg2 is constant, the greater Vg1 becomes, the more Vout increases. Vout converges to the value in formula (10). When Vg1 is constant, the greater Vg2 becomes, the less Vout decreases. Vout converges to the value in formula (11). In the above relationship, Vout cannot become more than Vd or less than Vss. When Vout approaches Vd or Vss, the change rate is reduced.

The pMOS FET T1 is energized by the summation of (V11, V12, . . . , V1n) as the gate voltage Vg1 so that Vout is increased.

While, by the summation of (V21, V22, . . . , V2n) as Vg2, Vout is decreased. A neural network is well modeled by the addition circuit in FIG. 1. This circuit is rather simple for constructing an artificial neural network. The weight of synapses in this neuron can be adjusted by the capacitance values of C1n and C2m. Capacitances in an LSI are easily constructed by shaping a metal layer for wiring and an emitter diffusion layer on both sides of $SiO_2$. The input voltage is input through capacitances at the gate of MOS FET, so the input impedance is high and electric power is spared.

Figure 4:
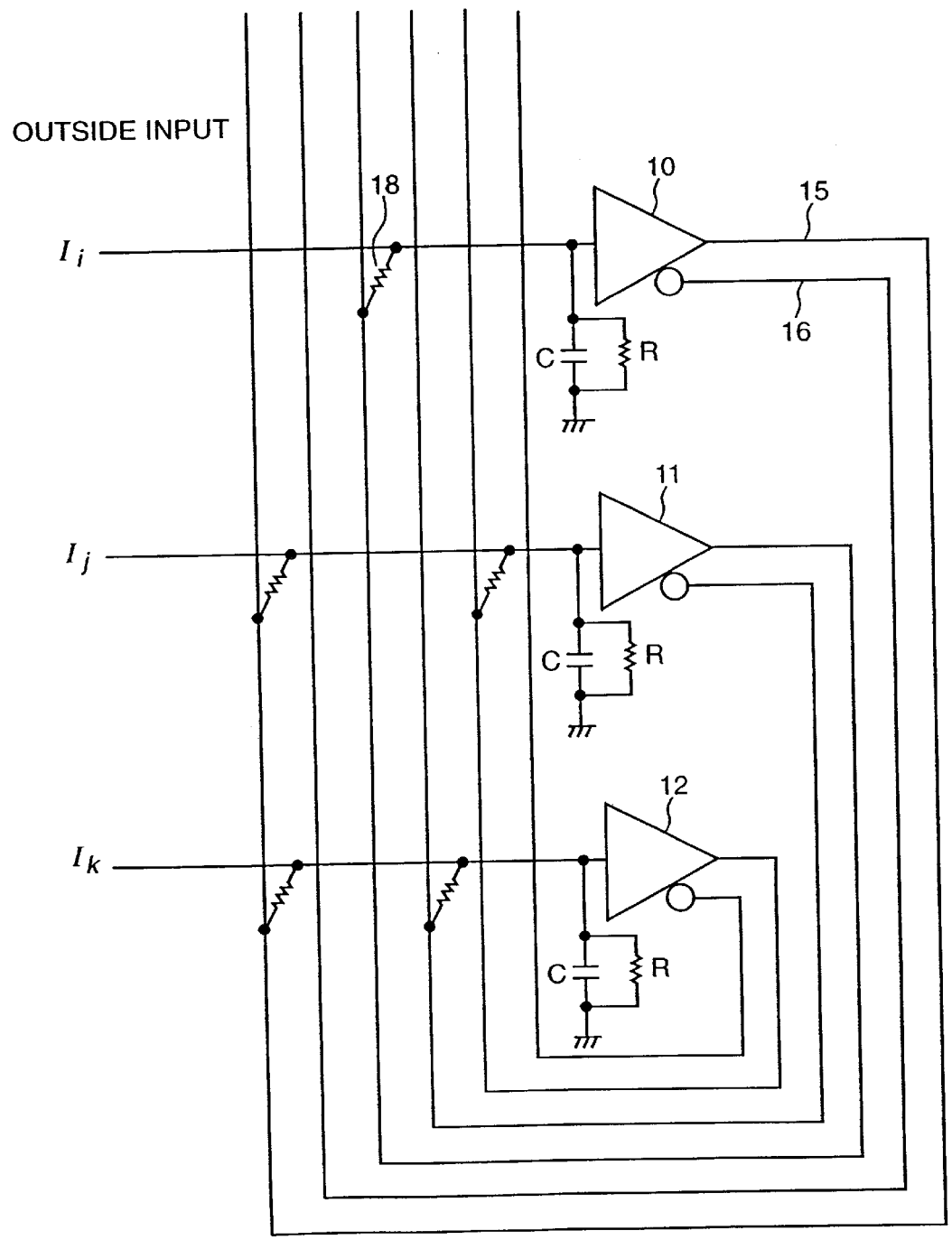
FIG. 4 shows a conventional computational circuit.

According to the first embodiment, an addition circuit is obtained simply as well as having low power and high speed. It is also suitable for a large scale artificial neural network. FIG. 4 shows one conventional neural network disclosed in the U.S. Pat. No. 4,660,166. In FIG. 1, cell bodies of a neuron consist of operational amplifiers 10, 11, and 12, and axons for transmitting action potential from one cell body to the following cell bodies consist of signal lines 15 and 16. A resistor 18 is provided as a synapse for connecting the axon and an action potential input of the cell body.

Figure 5:
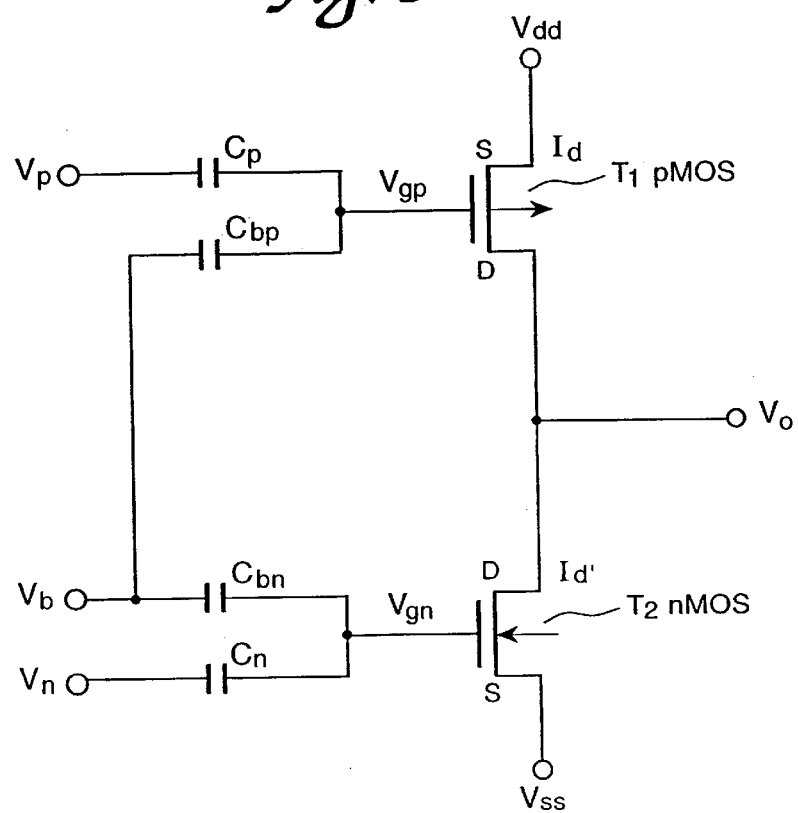
FIG. 5 shows a second embodiment of an addition circuit.

FIG. 5 shows a second embodiment of an addition circuit for receiving an input voltage Vp as positive number, an input voltage Vn as negative number, and common input voltage Vb. The addition circuit includes enhancement type pMOS FET transistor T1, NMOS FET transistor T2 and capacitances Cp, Cbp, Cbn and Cn for receiving the inputs. The capacitances Cp and Cbp receive Vp and Vb, respectively, and are commonly connected to a gate of T1, as a capacitive coupling. This capacitive coupling performs addition of Vp and Vb to generate a gate voltage Vgp of T1, as follows.

$$Vgp=(CpVp+CbpVb)/(Cp+Cbp) \quad (15)$$

The capacitance Cn and Cbn receive Vn and Vb, respectively, and are commonly connected to a gate of T2, as a capacitive coupling. This capacitive coupling performs addition of Vn and Vb to generate a gate voltage Vgn of T2, as follows.

$$Vgn=(CnVn+CbnVb)/(Cn+Cbn) \quad (16)$$

The transistor T1 is connected to its source to a high voltage Vdd and at its drain to a drain of T2, while T2 is connected at source to a low voltage Vss such as the ground. An output voltage Vo is output from the line between the source of T1 and the drain of T2. This connection creates what is called complementary MOS (CMOS). The transistor T1 becomes conductive when the gate voltage Vgp is within the range below.

$$Vs1-Vgp\geq Vt1 \quad (17)$$

where
  Vs1: source voltage of T1, and
  Vt1: threshold voltage of T1.
On the other hand, T1 is non-conductive when Vs1 is below Vgp.

$$Vs1-Vgp<Vt1 \quad (18)$$

The transistor T2 is similarly controlled by the gate voltage Vgn, that is, conductive when formula (19) is satisfied and non-conductive when formula (20) is satisfied.

$$Vgn-Vs2\geq Vt2 \quad (19)$$

$$Vgn-Vs2<Vt2 \quad (20)$$

where
  Vs2: source voltage of T2, and
  Vt2: threshold voltage of T2
Under the condition that Vp and Vn are constant, the output voltage Vo changes from Vdd to Vss when Vb exceeds Vt2. The gate voltages change in response to Cp, Cbp, Cbn and Cn.

Figure 6:
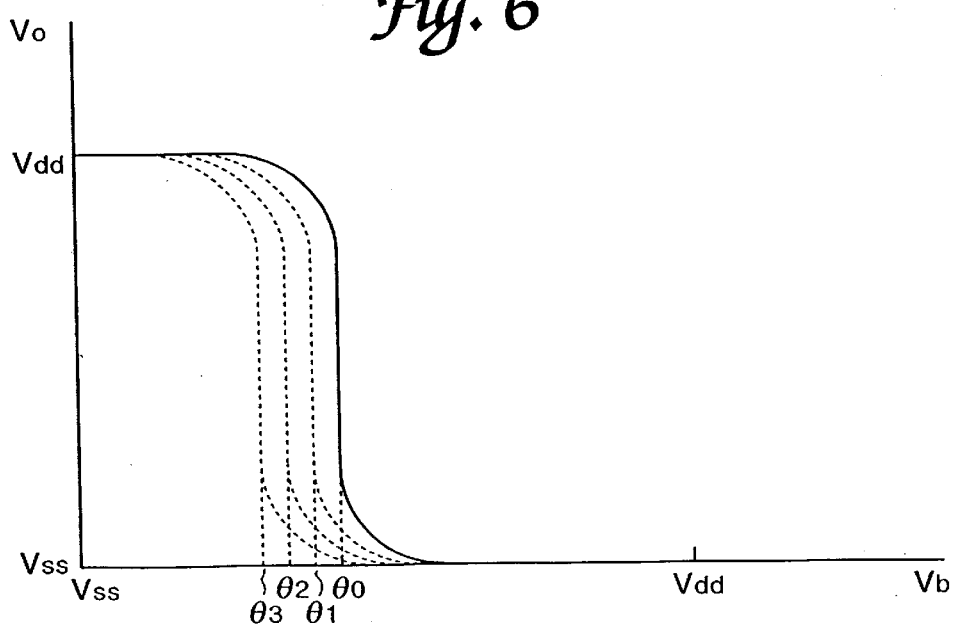
FIG. 6 is an input/output characteristics diagram of Vb vs Vout of the circuit shown in FIG. 5.

Under the condition that Cp, Cbp, Cbn and Cn are constant, Vgp and Vgn are adjusted by changing Vp or Vn. By increasing Vp, the difference between Vs1 and Vgp is diminished. The transistor T1 becomes inconductive due to the low voltage Vb. When input voltage Vn is increased, the gate voltage Vgn of T2 becomes higher so that T2 becomes conductive at the lower input voltage of Vb. These performances are shown in FIG. 6. An inversion voltage $\theta$ is defined as a voltage at which Vo is inverted from Vdd to Vss. When Vp and/or Vb are gradually increased, $\theta$ becomes smaller as shown by $\theta_o$, $\theta_1, \theta_2$ and $\theta_3$ in FIG. 6. These changes in inversion voltage can be applied to an artificial neuron as a self-learning factor. Similar to the above, $\theta$ is adjusted by Vp and Vn. $\theta_o$ in FIG. 6 is the inversion voltage when Vp=Vn=0.

Figure 7:
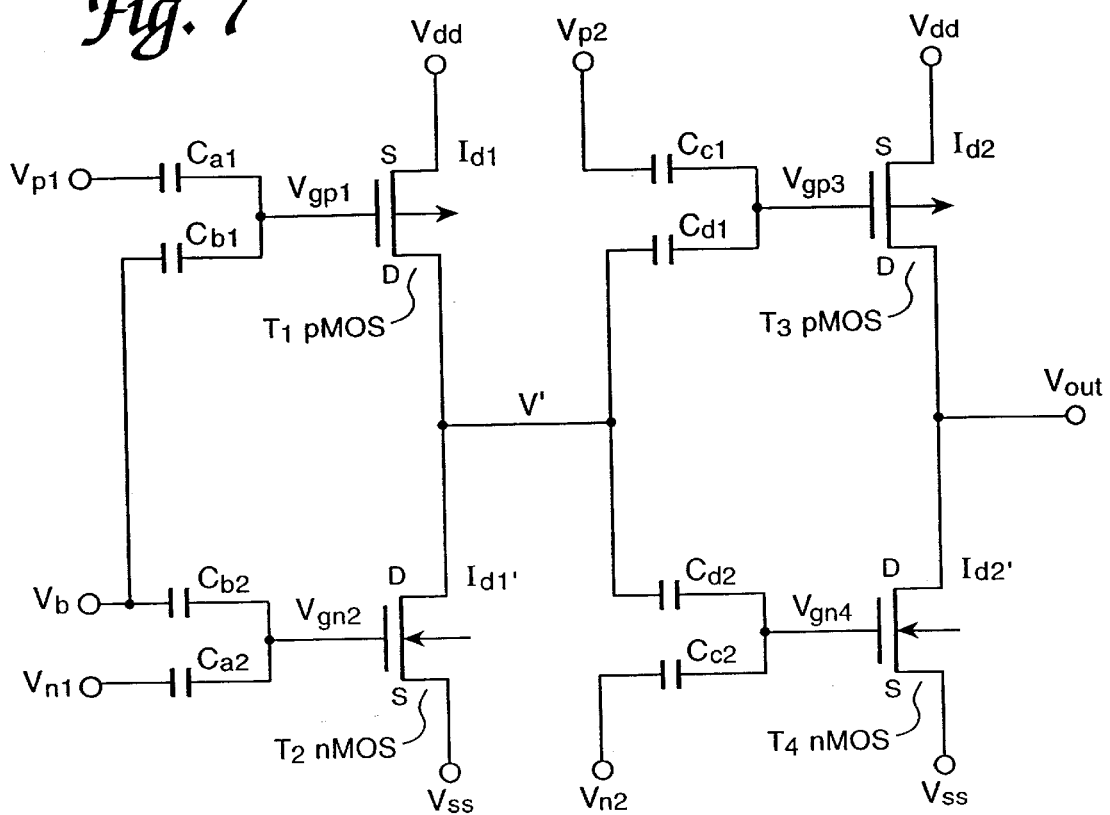
FIG. 7 shows the third embodiment of the addition circuit.

FIG. 7 shows the third embodiment of the addition circuit. This embodiment is a serially combined circuit of the second embodiment. The circuit includes two portions, the first portion consists of transistors T1 and T2, capacitances Ca1, Cb1, Cb2 and Ca2, corresponding to T1, T2, Cp, Cbp, Cbn and Cn in the second embodiment. The second portion consists of transistors T3 and T4, capacitances Cc1, Cd1, Cd2 and Cd2, corresponding to T1, T2, Cp, Cbp, Cbn and Cn in the second embodiment, respectively. The first input voltages Vp1, Vb, Vn1 are input to capacitance Ca1, capacitances Cb1 and Cb2 and capacitance Ca2, respectively. The output voltage V' from the first portion is input to the common capacitances Cd1 and Cd2. The second voltages Vp2 and Vn2 are input to capacitances Cc1 and Cc2, respectively. The power source voltage Vdd is connected to the source terminals of T1 and T3, and the lower voltage Vss is connected to the drains of T2 and T4. The final output voltage Vout is output from the drain of T3 and T4.

Figure 8:
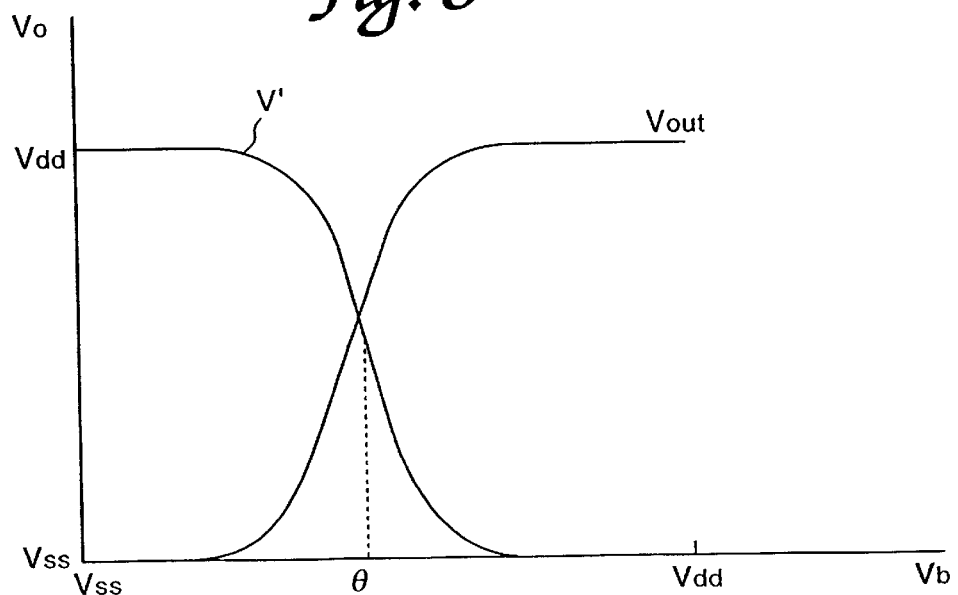
FIG. 8 is an input/output characteristics diagram of Vb vs V' and Vout of the circuit in FIG. 7.

The output voltage V' of the first portion is inverted by the second portion. FIG. 8 shows the relationship between V' and Vout. When V' changes from Vdd to Vss, Vout changes from Vss to Vdd. When V' is lowered to Vss, T3 becomes non-conductive and T4 becomes conductive, then Vout changes from Vss to Vdd.

When Vp2 is increased, the gate voltage Vgp3 of T3 is kept to be in the following range, even if V' is equal to Vss.

$$Vs3-Vgp3<Vt3 \quad (21)$$

Vs3: source voltage of T3,
Vgp3: gate voltage of T3, and
Vt3: threshold voltage of T3.

Therefore the transistor is kept non-conductive so that Vout is prevented from becoming Vdd.

When Vn2 is increased, the gate voltage Vgp4 of T4 is kept in the following range, even if V' is equal to Vss.

$$Vgp4-Vs4<Vt4 \quad (22)$$

Vs4: source voltage of T4
Vgp4: gate voltage of T4, and
VT4: threshold voltage of T4.

Therefore, the transistor is kept conductive so that Vout is nearly Vss.

The output voltage Vout is prevented from inversion even under the low V' ($\approx$Vss) condition by increasing Vp2 or Vns. The voltages Vp1 and Vn1 can be handled as excitatory inputs, and Vp2 and Vn2 can be inhibitory inputs. In the application of neural networks, the threshold of firing can be dynamically controlled by Vp1, Vn1, Vp2 and Vn2. This is advantageous for causing the learning of neurons. It is possible that the gate voltages are changed by capacitances Ca1, Cb2, Cb2, Ca2, Cc1, Cd1, Cd2 and Cc2, and the changing pattern of Vout with respect to Vd can be settled by changing the capacitances.

Figure 9:
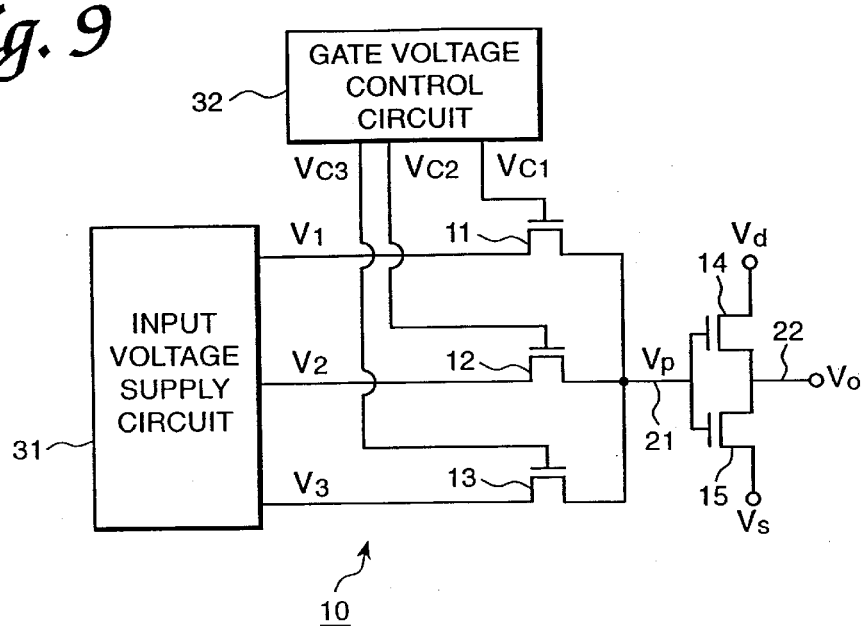
FIG. 9 shows the fourth embodiment of the addition circuit.

FIG. 9 is a circuit diagram of the fourth embodiment of addition circuit. The circuit has a plurality of nMOS transistors 11, 12 and 13, the sources of which are commonly connected to one output terminal 21, the drains of which are connected to an input voltage supply circuit 31 and the gates of which are connected to a gate voltage control circuit 32. The input voltage supply circuit 31 outputs a plurality of input voltages V1, V2 and V3 to the MOS transistors 11, 12 and 13, respectively. The gate voltage control circuit 32 outputs a plurality of control voltages Vc1, Vc2 and Vc3, which are settled within a range where MOS transistors have linear characteristics in the relationship between the drain current and the gate voltage. For the linear performance, the voltages Vc1, Vc2 and Vc3 are controlled to be not less than V1, V2 and V3, respectively.

The addition circuit further includes a source follower consisting of nMOS transistors 14 and 15. A source of nMOS transistor 14 is connected with a drain of nMOS transistor 15, a drain of NMOS transistor 14 is connected to a drain voltage Vd, a source of nMOS transistor 15 is connected to a source voltage Vs and their gates are commonly connected to the output terminal 21. The output terminal 21 has a voltage Vp determined by the voltages V1, V2, V3, Vc1, Vc2 and Vc3. nMOS transistors 14 and 15 generate output voltage $V_o$ at an output terminal 22 on the connection line between the source of nMOS transistor 14 and the drain of NMOS transistor 15. $V_o$ is nearly equal to Vp independently from the output load of nMOS transistors 14 and 15.

Figure 10:
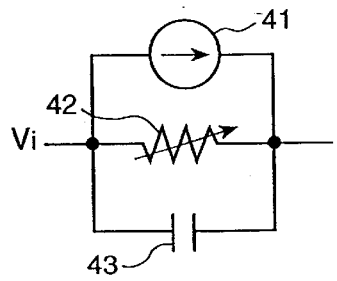
FIG. 10 shows an equivalent circuit of an nMOS transistor in the circuit of FIG. 9.

FIG. 10 shows an equivalent circuit of each nMOS transistor 11, 12 and 13. This circuit is a parallel circuit of a current source 41, resistance 42 and capacitance 43. A current through this circuit is changed according to the input voltage Vi and gate voltage Vc1, the resistance and capacitance are also changed during this change.

When the impedances of nMOS transistors 11, 12 and 13 are defined as Z2, Z2 and Z3, the output voltage Vp is expressed as follows.

$$Vp=(\Sigma(Zi \times Vi))/Zi \quad (23)$$

Vp is represents a weighted addition result of Vi, and the impedance Zi decreases in response to the increase of Vci, then the weighting of the input voltage is decreased.

The output voltage Vo is at a low level until Vp exceeds a threshold voltage determined by Vci and then becomes nearly equal to Vp.

The circuit in FIG. 9 can be used as an artificial neural network receiving a plurality of input voltages from V1 to V3 and outputting Vo to the next neuron.

Figure 11:
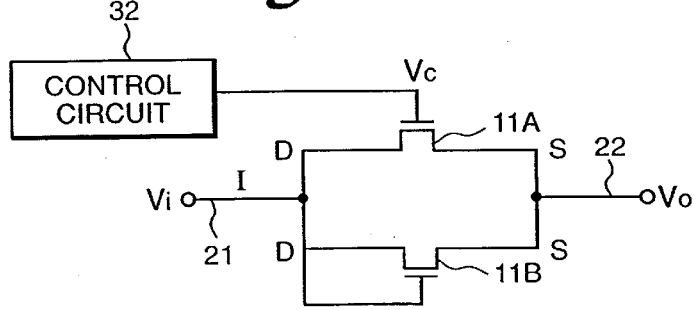
FIG. 11 shows the first embodiment of a variable resistance.

FIG. 11 shows an improvement of the impedance circuit created by the nMOS transistors in FIG. 9. A pair of MOSs 11A and 11B, nMOS or pMOS transistors, are connected at their drains and at their sources with each other. The control circuit is connected with the gate of MOS transistor 11A for inputting Vc as the gate voltage. The gate of the other MOS transistor 11B is connected to its drain. Input voltage Vi is input to the common drain of the MOS transistors and the output voltage Vo is output from the common source. Here Vc is a voltage based on Vi or Vo, and Vi and Vo should be higher than the substrate voltage. The impedance of the parallel circuit of MOS transistors changes in response to the voltage Vc.

Figure 12:
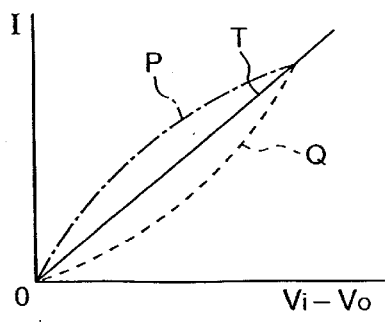
FIG. 12 shows an input/output characteristics diagram of the circuit shown in FIG. 11.

The relationships between the drain current I and the drain-source voltage (Vi–Vo) are shown in FIG. 12 for single MOS 11A, and the combination of MOS transistors, using references P, Q and T, respectively. The current I of P and Q change non-linearly and are symmetric to each other centering on the line T. The combination of MOS transistors has good linear performance due to the cancellation of non-linearity.

Therefore, the weights for addition can be linearly controlled. This is advantageous for achieving accurate control of the resistance, weight or multiplier values to be added. When this circuit is used as a variable resistance for an operational amplifier, linear gain control is obtained. In order to obtain good linearity of the circuit, MOS transistors should be shaped in substantially the same shape.

Figure 13:
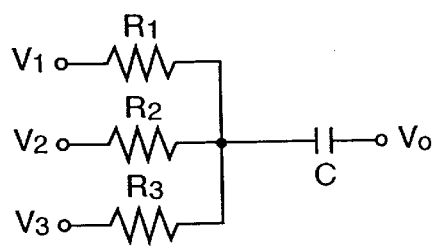
FIG. 13 shows the fifth embodiment of the addition circuit.

FIG. 13 shows the fifth embodiment of the addition circuit consisting of a plurality of resistors R1, R2 and R3, as a resistance coupling. The resistors have input terminals receiving input voltages V1, V2 and V3 and output terminals commonly connected to a capacitance C at an input side. There is generated an output voltage Vo at an output side of the capacitance, as follows $$Vo = (V1/R1 + V2/R2 + V3/R3)/(1/R1 + 1/R2 + 1/R3) \quad (24)$$

The circuit performs weighted addition with weights defined by the resistances. The formula (24) is valid under the condition that no current is generated at the common output terminal, that is, the electric charge of the capacitance C is constant. A capacitance or high impedance is necessary at the output side of the resistances for minimizing the current. By increasing the resistance value of resistors, the current decreases.

Figure 14:
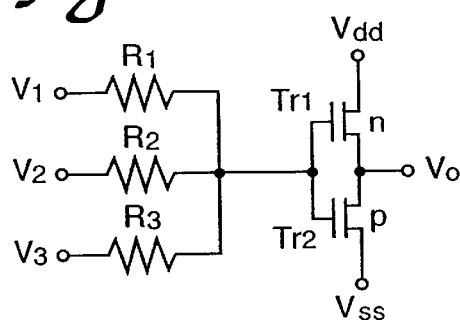
FIG. 14 shows the sixth embodiment of the addition circuit.

FIG. 14 is a circuit diagram of the sixth embodiment of the addition circuit. This embodiment is different from the fifth embodiment in that the capacitance C is substituted by a source follower consisting of nMOS transistor Tr1 and pMOS transistor Tr2. Trn is connected at its drain with a voltage Vdd and at its source with a drain of Tr2. Tr2 is connected at its source with a voltage Vss. The output terminal of the resistors are the gates of the MOS transistors and Vo is output from the juncture of the source of Tr1 and the drain of Tr2. The non-linear I/O characteristic obtained are useful for an artificial neuron.

Figure 15:
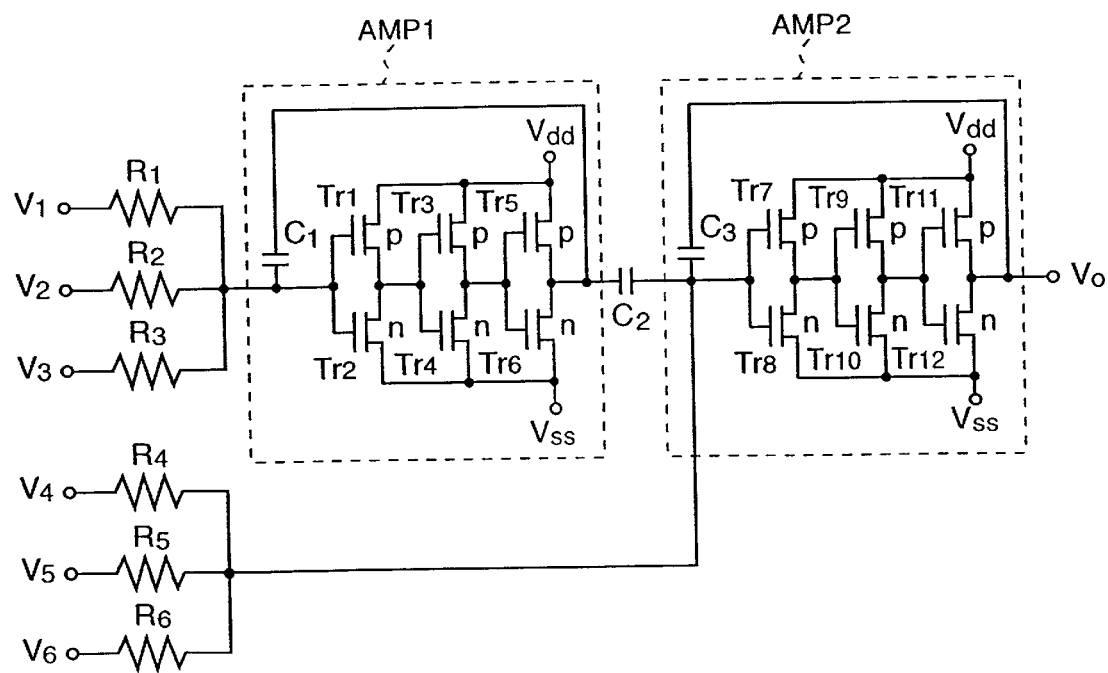
FIG. 15 shows the seventh embodiment of the addition circuit.

FIG. 15 is the seventh embodiment of addition circuit for positive and negative addition. There are two groups of addition circuits each of which consists of a resistance coupling and an inverting amplifier. The first resistance coupling consists of R1, R2 and R3 and the second resistance coupling consists of R4, R5 and R6. Input voltages V1, V2, V3, V4, V5 and V6 are input to the resistances R1, R2, R3, R4, R5 and R6, respectively.

An output of the first resistance coupling is connected to the first inverting amplifier AMP1, an output of which is connected through a capacitance C2 to the second inverting amplifier AMP2. The second resistance coupling is connected directly to the second inverting amplifier AMP2.

AMP1 consists of three stage inverters serially connected, the first stage inverter of MOS transistors Tr1 and Tr2, the second stage inverter of MOS transistors Tr3 and Tr4 and the third stage inverter of MOS transistors Tr5 and Tr6. An output of the third stage inverter is fed through a capacitance C1 back to an input of the first inverter. AMP2 consists of three stage inverters serially connected, the first stage inverter of MOS transistors Tr7 and Tr8, the second stage inverter of MOS transistors Tr9 and Tr10 and the third stage inverter of MOS transistors Tr11 and Tr12. An output of the third stage inverter is fed through a capacitance C3 back to an input of the first inverter. This feed-back system is provided to amplify the addition. AMP1 and AMP2 invert the inputs and have good linearity due to the high gain of the three stages. Then, the output of AMP2 is the non-inverted output relative to the input to AMP1 and the output of AMP1 is the inverted output. By connecting the output of AMP1 and the output of the second resistance coupling at the input of AMP2, the output of AMP2 is a subtraction result of the AMP2 output from the AMP1 output. Both outputs are weighted by AMP1 and AMP2, respectively. When this embodiment is used for an artificial neuron, V1, V2 and V3 are excitatory inputs, and V4, V5 and V6 are inhibitory inputs.

In the above three embodiments, resistances have a fixed resistance value, however, variable resistances may be used to change the weights.

Figure 16:
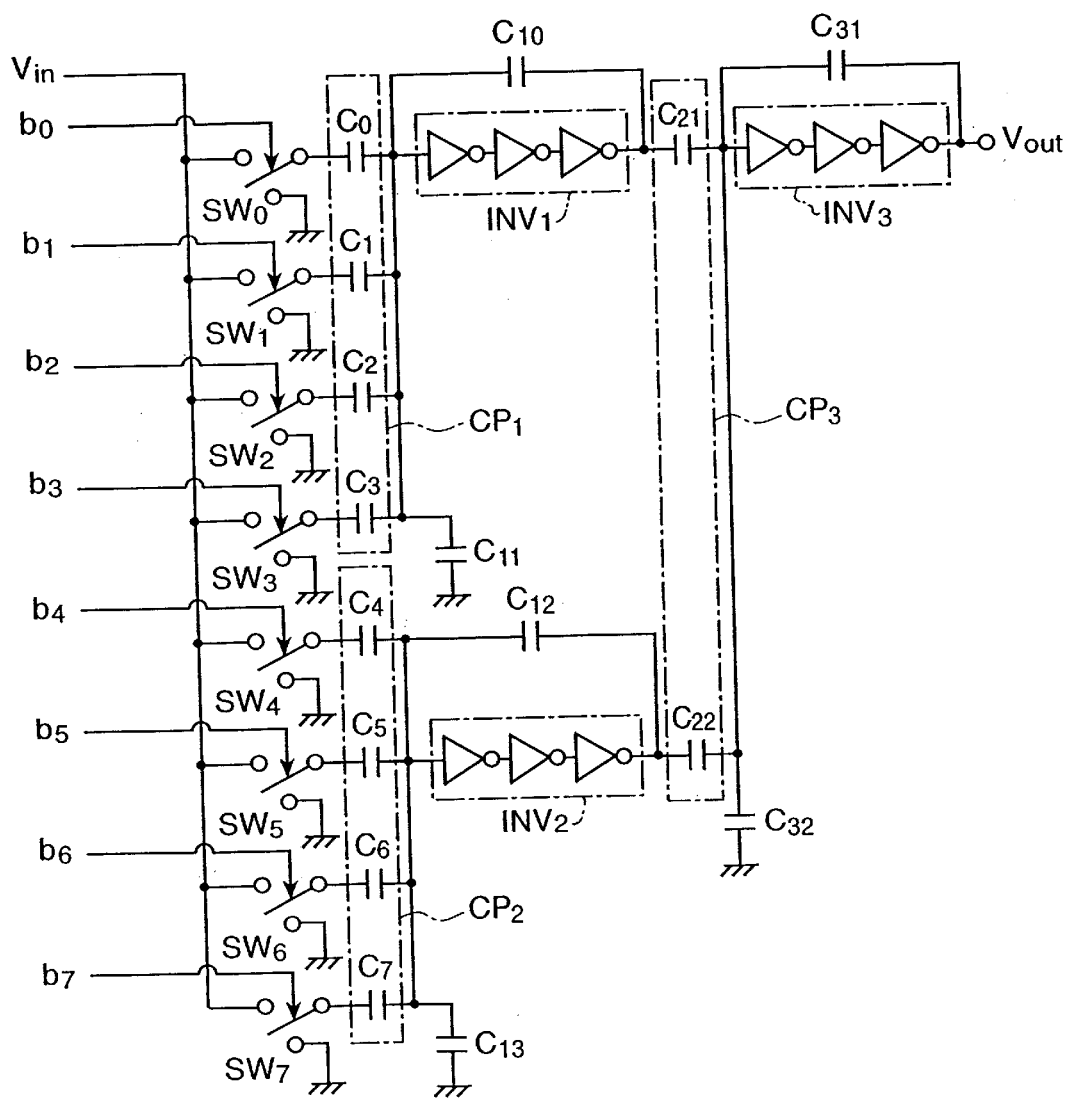
FIG. 16 shows the first embodiment of a multiplication circuit.

FIG. 16 shows another type of computation circuit for multiplication.

The multiplication circuit consists of a plurality of switching means SW1 to SW7 commonly receiving an analog input voltage Vin which are controlled by a digital signal of bits from b0 to b7. The switching means are classified into two groups. The first group is from SW0 to SW3 and the second group is from SW4 to SW7. The first group is connected to a capacitive coupling CP1 and the second to CP2. CP1 consists of capacitances C0 to C3 with capacities corresponding to the weights of b0 to b3. CP2 consists of capacitances C4 to C7 with capacities corresponding to the weights of b4 to b7. CP1 and CP2 are grounded through capacitances C11 and C13, respectively. Outputs from CP1 and CP2 are input to the inverters INV1 and INV2, respectively. Outputs of the inverters are added with weights by a capacitive coupling CP3. CP3 is grounded through a capacitance C32 and outputs an analog output voltage Vout. Each of INV1 to INV3 consist of three stage inverters serially connected so that outputs have high accuracy due to the high gain of the three stage inverters. INV1 and INV3 have a feed-back line from their outputs to their own inputs through capacitances C10, C12 and C31, respectively. The relationship among capacitances are as follows.

$$C10 - C11 = C0 + C1 + C2 + C3 \quad (25)$$

$$C12 - C13 = C4 + C5 + C6 + C7 \quad (26)$$

$$C31 + C32 = C21 + C22 \quad (27)$$

and, $$\sum_{i=0}^{3} Ci(Vi - V11) + C10(V11 - V21) + C11V11 = 0 \quad (28)$$

$$\sum_{i=4}^{7} Ci(Vi - V12) + C12(V12 - V22) + C13V12 = 0 \quad (28)$$

$$C21V21 + C22V22 + C31(V31 - Vout) + C32V31 = 0 \quad (29)$$

$$V21 = GV11, \ V22 = GV12, \ Vout = GV31 \quad (30)$$

where,
G: open gains of INV1, INV2 and INV3
Vi: input voltage to C0 to C7 (i=0~7)
V11: input voltage of INV1
V12: input voltage of INV2
V31: input voltage of INV3
then, the following formula is approximately obtained.

$$V21 = \sum_{i=0}^{3} CiVi/C10 \quad (31)$$

$$V22 = \sum_{i=4}^{7} CiVi/C12 \quad (32)$$

$$Vout = (C21V21 + C22V22)/C31 \quad (33)$$

Here, each of SWi is connected in response to the bit bi of the digital data alternatively to Vin or the ground so that Vi is equal to Vin or "0". Each capacitance is shaped by one or plurality of unit capacitances Ci, as follows.

$$Ci = 2^i \times Cu \ (i=0\sim3) \quad (34)$$

$$Ci = 2^{i-4} \ (i=4\sim7) \quad (35)$$

$$C11 = C13 = C32 = Cu \quad (36)$$

$$C22 = 2^4 \times C21 \quad (37)$$

$$C31 = 2^4 \times Cu \quad (38)$$

Therefore, the final computation result is a multiplication of analog and digital data.

$$Vout = \sum_{i=0}^{7} 2ibiVin/2^8 \quad (39)$$

and, $$Vout = \sum_{i=0}^{7} 2ibiVin/2^7 \quad (40)$$

when $$C31 = 2^3 \times Cu + tm \quad (41)$$

The formula (40) shows twice the output level as the level of formula (39). Various output voltage levels can be obtained by such weight adjustment.

As will be understood by the formula (35), the capacitance range of C0 to C7 is on the order of 23 because of the classification of the upper bits group and the lower bits group as well as the integration of both groups. This is advantageous in manufacturing LSI circuits because a large capacitance requires a lot of area on the silicon wafer.

As noted above, the multiplication circuit of FIG. 16 has two capacitive couplings, CP1 and CP2, in the first stage. The outputs of these capacitive couplings are input to the second stage capacitive coupling CP3 through inverters INV1 and INV2, respectively. CP1 integrates one or more input voltages among b0 and b3 connected by switches SW0 to SW3, respectively. When switches SW0 and SW3 are closed, only b0 and b3 are connected to capacitances C0 and C3, respectively. Similarly, CP2 integrates one or more input voltages among b4 to b7. Grounded capacitance C11 is provided to adjust the output voltage V21 of INV1. Voltage V21 is obtained as follows. First, recall that according to equation (28)

$$\sum_{i=0}^{3} Ci(Vi - V11) + C10(V11 - V21) + C11 V11 = 0 \quad (28)$$

and from equation (25)

$$C10 - C11 = \sum_{i=0}^{3} Ci$$

then, $$V21 = \frac{\sum_{i=0}^{3} Ci(Vi - V11)\left(\sum_{i=0}^{3} Ci - C10 - C11\right)}{C10} = \frac{\sum_{i=0}^{3} CiVi}{C10}$$

Therefore, grounded capacitance C11 simplifies the formula for obtaining V21 because it, in cooperation with C10, cancels the term of V11. Similarly, grounded capacitance C13, in cooperation with C12, cancels the term associated with V12 in the formula for obtaining V22. It is useful for designing the capacities of capacitances for calculating a predetermined formula.

The feedback capacitance compensates linearity of input and output by feeding back its output to its input. The relationship between the input and output is shown above.

What is claimed is:

1. A computational circuit comprising:

a first resistance coupling receiving a first plurality of analog input voltages, the first resistance coupling having a plurality of resistors, each of the resistors receiving one of the first plurality of analog input voltages, the first resistance coupling having a common output terminal for outputting therefrom a weighted addition result of the first plurality of analog input voltages;

a first inverting amplifier circuit comprising an odd number of CMOS inverters serially connected from a first stage to a last stage and a feedback capacitance connecting an output of the CMOS inverter of the last stage to an input of the CMOS inverter of the first stage, the input of the CMOS inverter of the first stage operatively connected to the common output of the first resistance coupling;

a second resistance coupling receiving a second plurality of analog input voltages, the second resistance coupling having a plurality of resistors, each of the resistors receiving one of the second plurality of analog input voltages, the second resistance coupling having a common output terminal for outputting therefrom a weighted addition result of the second plurality of analog input voltages;

a second inverting amplifier circuit comprising an odd number of CMOS inverters serially connected from a first stage to a last stage and a feedback capacitance connecting an output of the CMOS inverter of the last stage to an input of the CMOS inverter of the first stage, the input of the CMOS inverter of the first stage operatively connected to the common output of the second resistance coupling; and a capacitance connected between the output of the CMOS inverter of the last stage of the first inverting amplifier and the input of the CMOS inverter of the first stage of the second inverting amplifier, whereby the weighted addition of the second resistance coupling is subtracted from the weighted addition of the first resistance coupling.

* * * * *